(12) United States Patent
Tsai

(10) Patent No.: US 11,249,142 B2
(45) Date of Patent: Feb. 15, 2022

(54) DETECTING DEVICE AND DETECTING METHOD

(71) Applicant: Wistron Corporation, New Taipei (TW)

(72) Inventor: Meng-Ru Tsai, New Taipei (TW)

(73) Assignee: Wistron Corporation, New Taipei (TW)

( * ) Notice: Subject to any disclaimer, the term of this patent is extended or adjusted under 35 U.S.C. 154(b) by 102 days.

(21) Appl. No.: 16/111,223

(22) Filed: Aug. 24, 2018

(65) Prior Publication Data

US 2019/0317157 A1 Oct. 17, 2019

(30) Foreign Application Priority Data

Apr. 16, 2018 (TW) .................................. 107112858

(51) Int. Cl.
*G01R 31/44* (2020.01)
*H03K 5/24* (2006.01)
*H03H 7/06* (2006.01)

(52) U.S. Cl.
CPC .............. *G01R 31/44* (2013.01); *H03H 7/06* (2013.01); *H03K 5/24* (2013.01)

(58) Field of Classification Search
None
See application file for complete search history.

(56) References Cited

U.S. PATENT DOCUMENTS

| | | | | |
|---|---|---|---|---|
| 2001/0028227 A1* | 10/2001 | Lys | ....................... | A61N 5/0616 315/317 |
| 2010/0141153 A1* | 6/2010 | Recker | ................... | H05B 47/20 315/149 |
| 2011/0068700 A1* | 3/2011 | Fan | ........................ | H05B 45/44 315/185 R |
| 2011/0273095 A1* | 11/2011 | Myers | .................... | H05B 45/37 315/119 |
| 2014/0354150 A1* | 12/2014 | Joseph | ................... | H05B 45/20 315/51 |
| 2015/0359057 A1* | 12/2015 | Lee | ....................... | G09G 3/3406 345/691 |

FOREIGN PATENT DOCUMENTS

CN 107846753 A 3/2018

* cited by examiner

*Primary Examiner* — Nasima Monsur
(74) *Attorney, Agent, or Firm* — Winston Hsu

(57) ABSTRACT

A detecting device for detecting a stack light state includes a low-pass filter configured to perform low-pass filtering on an input signal to generate a first output voltage; and a logic circuit coupled to the low-pass filter and configured to determine the stack light state according to the first output voltage; wherein the input signal is a pulse width modulation signal and a voltage level of the first output voltage is between a highest voltage level and a lowest voltage level of the pulse width modulation signal.

15 Claims, 4 Drawing Sheets

DETECTING DEVICE AND DETECTING METHOD

BACKGROUND OF THE INVENTION

1. Field of the Invention

The present invention relates to a detecting device and detecting method, and more particularly, to a detecting device and detecting method capable of detecting a control signal of a stack light so as to determine a state of the stack light.

2. Description of the Prior Art

In a conventional environment of industrial internet of things, many devices and machines are equipped with multi-color stack light displays for displaying current states of the devices and machines, wherein the most common stack light displays are with red, yellow and green. Therefore, there is a trend to perform big data collection and analysis for the stack light states of the stack light displays. In general, there are three states of the stack light displays, such as persistent on, persistent off and twinkling. It is difficult to determine the stack light state when detecting the state of the twinkling stack light display, since the twinkling state of different stack light displays are not identical, especially when the twinkling frequency is discordant or a time period of the persistent on/off of the stack light displays are different. In addition, in order to correctly determine the twinkling frequency of the stack light displays, a period of time is needed to calculate a number of repeat times of the stack light being on and off. For example, the stack light display is determined as twinkling when the stack light display is on and off for at least twice in a period of time. In other words, under a situation of the stack light is on for 2 seconds and off for 2 seconds respectively, 8 seconds is needed to calculate the number of repeat times of the stack light being on and off, such that the twinkling state of the stack light display can be determined, which causes wastes and damages of costs to the environment of industrial internet of things in pursuing a real-time reporting of the devices. Therefore, there is a necessity to improve the conventional detecting method for the stack light.

SUMMARY OF THE INVENTION

Therefore, the present invention provides a detecting device and a detecting method using the same for a stack light, which utilizes a control signal of the stack light to correctly determine an output signal of the twinkling stack light, and effectively determine the stack light state and realize a real-time detection.

The present invention discloses a detecting device for detecting a stack light state, comprising a low-pass filter configured to perform low-pass filtering on an input signal to generate a first output voltage; and a logic circuit coupled to the low-pass filter and configured to determine the stack light state according to the first output voltage; wherein the input signal is a pulse width modulation signal and a voltage level of the first output voltage is between a highest voltage level and a lowest voltage level of the pulse width modulation signal.

The present invention further discloses a detecting method for detecting a stack light state, comprising performing low-pass filtering on an input signal to generate a first output voltage; and determining the stack light state according to the first output voltage; wherein the input signal is a pulse width modulation signal and a voltage level of the first output voltage is between a highest voltage level and a lowest voltage level of the pulse width modulation signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
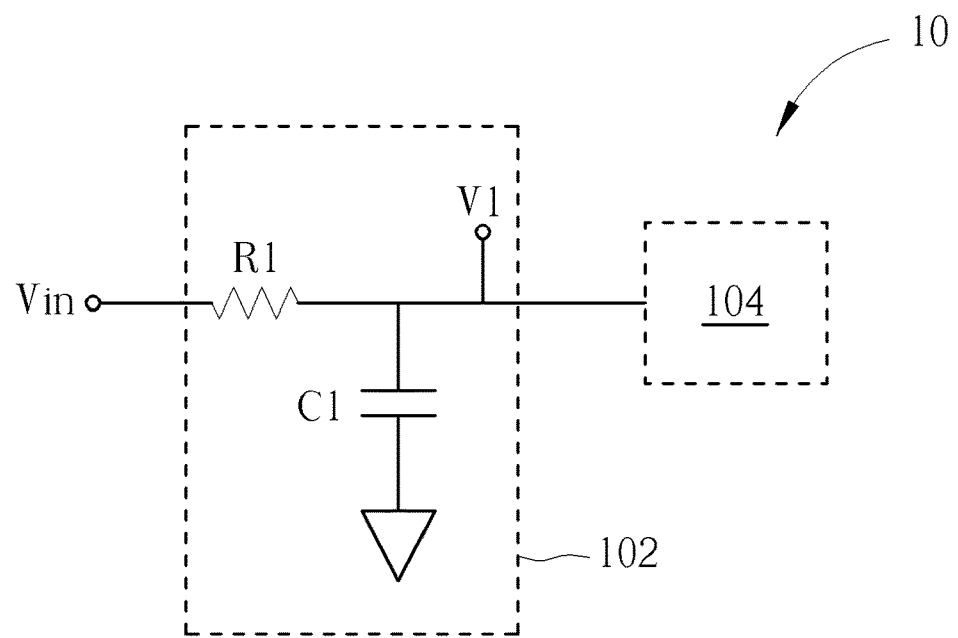
FIG. 1 is a schematic diagram of a detecting device according to an embodiment of the present invention.

Please refer to FIG. 1, which is a schematic diagram of a detecting device 10 according to an embodiment of the present invention. The detecting device 10 may detect a stack light state of a device or a machine in an environment of industrial internet of things, which includes a low-pass filter 102 and a logic circuit 104. The low-pass filter 102 includes a resistor R1 and a capacitor C1, and is configured to perform low-pass filtering on an input signal Vin, so as to generate a first output voltage V1. In this embodiment, the input signal Vin may be a control signal related to the stack light, e.g. a pulse width modulation (PWM) signal, and the first output voltage V1 may be a direct-current (dc) voltage. The logic circuit 104 is coupled to the low-pass filter 102 and configured to determine the stack light state according to the first output voltage V1, wherein the first output voltage V1 is between a highest voltage level and a lowest voltage level of the PWM signal. Therefore, the low-pass filter 102 of the present invention may convert the PWM control signal, which is related to the stack light, into the first output voltage V1, and the logic circuit 104 may simultaneously determine an on/off state of the stack light.

In detail, the low-pass filter 102 may perform the low-pass filtering on the PWM control signal of the stack light, i.e. the input signal Vin, so as to generate the first output voltage V1, which is close to the dc voltage, and outputted dc voltage levels corresponding to the PWM control signals with different frequencies are different. Therefore, when the stack light state is persistent on or off, the PWM control signal is maintained at the highest voltage level or the lowest voltage level for a long period. Since the period of the stack light being persistent on or off is larger than times of an RC time constant of the low-pass filter 102. Under this situation, the first output voltage V1 generated by the low-pass filter 102 is in accordance with the highest voltage level or the lowest voltage level of the PWM control signal since the capacitor C1 of the low-pass filter 102 is fully charged or fully discharged. That is, when the PWM control signal is maintained at the highest voltage level and the lowest voltage level for a long period, the stack light state may be respectively determined as persistent on and off accordingly.

Assume that a range of twinkling frequency of the stack light is between 0.25 Hz and 10 Hz, under this circumstance, the detecting device 10 first determines a dc voltage value of the first output voltage V1 of the PWM control signal passing through the low-pass filter 102, wherein a range of the dc voltage value of the first output voltage V1 is between the highest voltage level and the lowest voltage level of the PWM control signal. Then, the logic circuit 104 determines the voltage value of the first output voltage V1 so as to determine whether the voltage value of the first output voltage V1 is in the corresponding range of twinkling frequency of the stack light accordingly. Therefore, without spending extra time for calculating a number of times of the PWM control signal converting between the highest level and the lowest level, the stack light state is determined, an effect of reporting the stack light state in real-time is achieved.

Figure 2:
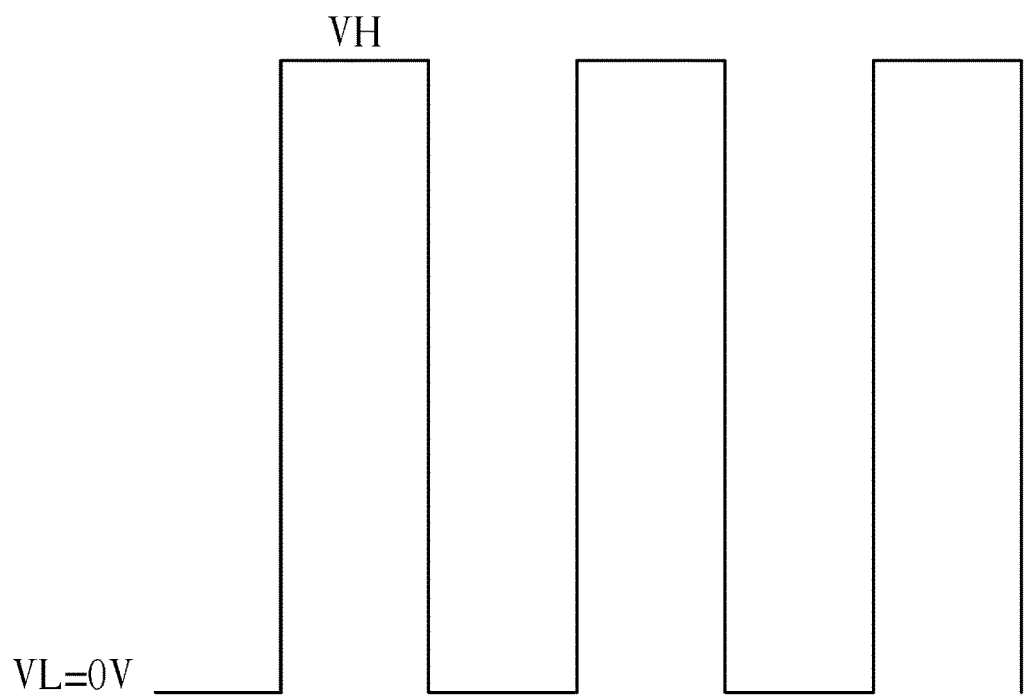
FIG. 2 is a schematic diagram of a pulse width modulation signal.
Figure 3:
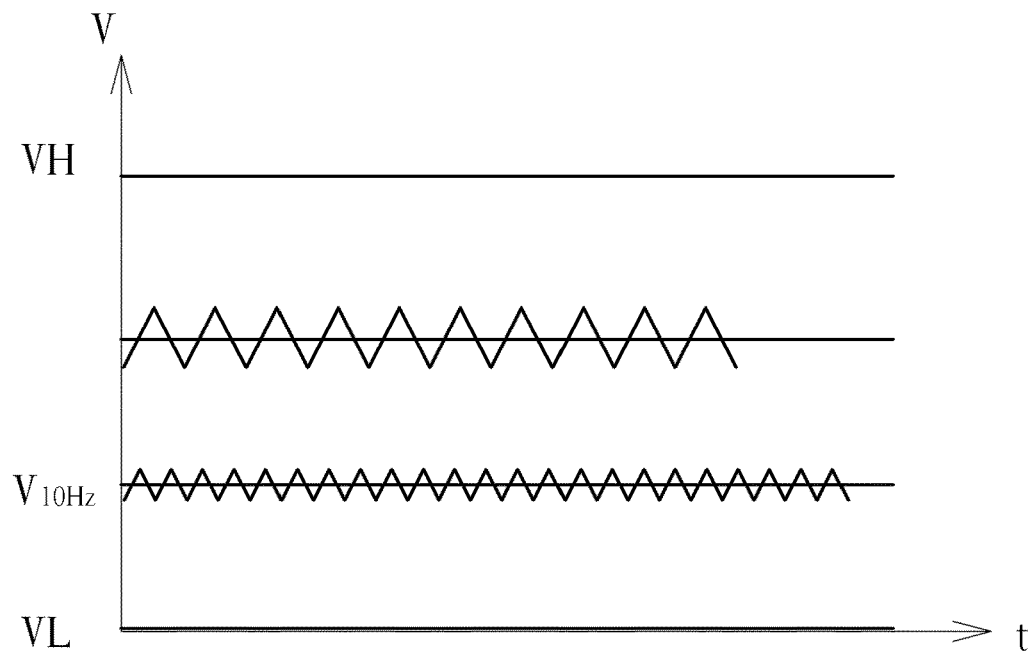
FIG. 3 is a schematic diagram of a first output voltage according to an embodiment of the present invention.

For example, please refer to FIG. 2, which is a schematic diagram of a pulse width modulation signal. As shown in FIG. 2, the PWM control signal has a highest voltage level VH and a lowest voltage level VL. Notably, in this example, the lowest voltage level VL may be 0V. When the stack light state is persistent on or persistent off, the PWM control signal is maintained at the highest voltage level or the lowest voltage level for a long period. Therefore, when the PWM control signal is maintained at the highest voltage level VH, i.e. the stack light is in the persistent on state. In contrast, when the PWM control signal is maintained at the lowest voltage level VL (e.g. 0V), the stack light is in the persistent off state. In addition, the dc voltage level corresponding to the first output voltage V1 varies when the PWM control signals with different twinkling frequencies pass through the low-pass filter 102. Please refer to FIG. 3, which is a schematic diagram of the first output voltage V1 according to an embodiment of the present invention. The first output voltage V1 is between the highest voltage level VH and the lowest voltage level VL (e.g. 0V). When the twinkling frequency is higher (e.g. 10 Hz), the corresponding dc voltage level $V_{10\ Hz}$ is lower, a charging/discharging time of the capacitor C1 of the low-pass filter 102 is shorter, and as a result, a generated ripple amplitude is smaller. In contrast, when the twinkling frequency is lower (e.g. 0.25 Hz), the corresponding dc voltage level $V_{0.25\ Hz}$ is higher, the charging/discharging time of the capacitor C1 of the low-pass filter 102 is longer, and thus, the generated ripple amplitude is larger.

Therefore, when the dc voltage level of the first output voltage V1 (i.e. the PWM control signal after the low-pass filtering of the low-pass filter 102) corresponds to the twinkling frequencies between 0.25 Hz and 10 Hz, the stack light is in the persistent on state. Similarly, when the dc voltage level of the first output voltage V1 is higher than the dc voltage level $V_{0.25\ Hz}$ corresponding to the twinkling frequency at 0.25 Hz, the stack light is in the persistent on state; when the dc voltage level of the first output voltage V1 is lower than or equal to the dc voltage level $V_{10\ Hz}$ corresponding to the twinkling frequency at 10 Hz, the stack light is in the persistent off state. Therefore, the low-pass filter 102 of the detecting device 10 performs the low-pass filtering on the PWM control signal, so as to determine the stack light state according to the voltage level of the first output voltage V1 in real-time.

In brief, the low-pass filter 102 of the detecting device 10 of the present invention converts the control signal of the stack light into the first output voltage V1, which is close to the dc voltage, so as to determine the on/off state of the stack light, and provide detecting results in real-time. Notably, those skilled in the art may make proper modifications to the detecting device of the present invention according to different system requirements, and not limited thereto, which all belong to the scope of the present invention.

Figure 4:
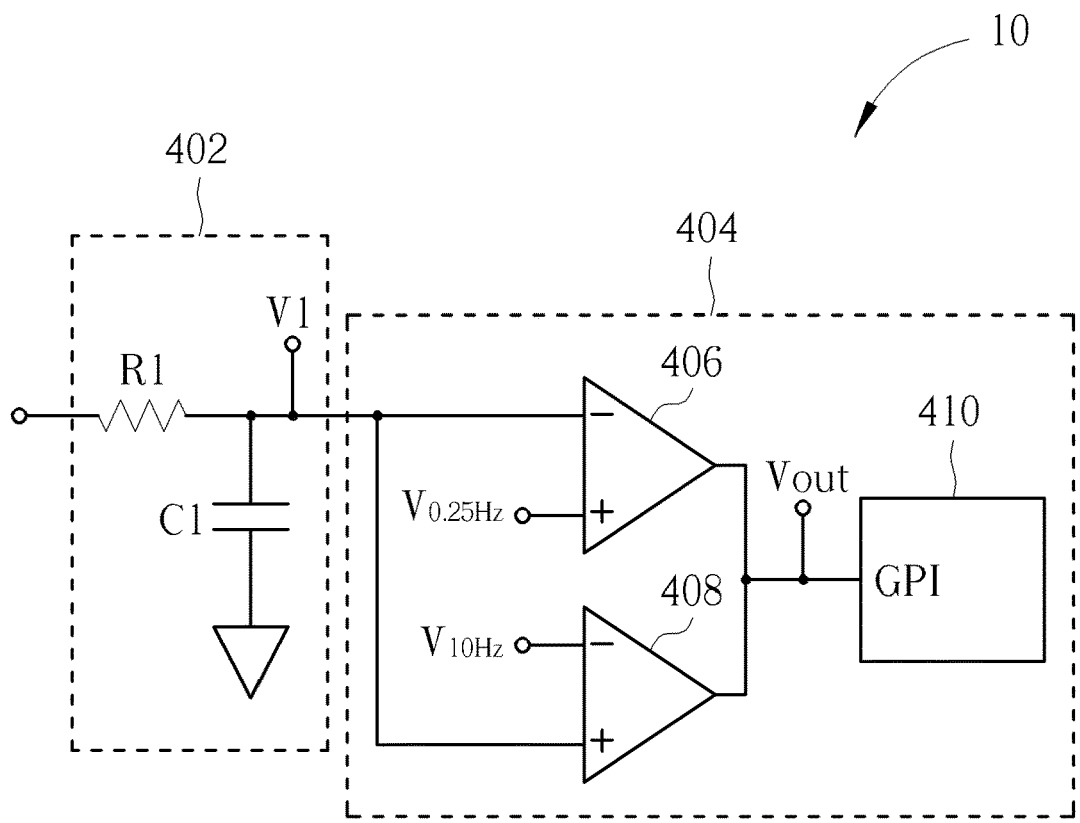
FIGS. 4-6 are schematic diagrams of a detecting device according to embodiments of the present invention.

Please refer to FIG. 4, which is a schematic diagram of a detecting device 40 according to an embodiment of the present invention. In this embodiment, the detecting device 40 includes a low-pass filter 402 and a logic circuit 404. Different with the detecting device 10, the logic circuit 404 includes voltage comparators 406, 408 and a processor 410. The voltage comparators 406, 408 are utilized for converting a first output voltage V1 generated by the low-pass filter 402 into a plurality of logic results. Then, the processor 410 determines the stack light state accordingly. In this embodiment, the voltage comparators 406, 408 are respectively utilized for determining relationships between the first output voltage V1 with the voltage level $V_{0.25\ Hz}$ and the voltage level $V_{10\ Hz}$. The processor 410 may include a general-purpose input (GPI) pin, so as to determine a voltage level of an output voltage Vout, e.g. a high voltage level or a low voltage level. More specifically, the voltage comparator 406 is utilized for determining whether the voltage level of the first output voltage V1 is lower than the voltage level $V_{0.25\ Hz}$ or not, i.e. the voltage level corresponding to the twinkling frequency at 0.25 Hz. When the outputted logic result is YES, the voltage comparator 406 outputs the high voltage level; that is, the current twinkling frequency of the stack light is higher than 0.25 Hz. Similarly, the voltage comparator 408 is utilized for determining whether the voltage level of the first output voltage V1 is higher than voltage level $V_{10\ Hz}$ or not. When the outputted logic result is YES, the voltage comparator 408 outputs the high voltage level; that is, the current twinkling frequency of the stack light is lower than 10 Hz. Therefore, with a design of logic AND at the output pins of the voltage comparator 406 and the voltage comparator 408, when the output voltage Vout is at the high voltage level, which represents that a variation frequency of the PWM control signal is between 0.25 Hz and 10 Hz, the processor 410 may determine that the stack light is in the twinkling state accordingly. When the output voltage Vout is at the low voltage level (i.e. at least one of the outputted logic results among the voltage comparators 406, 408 is at the low voltage level) which represents that the variation frequency of the PWM control signal is higher than 10 Hz or lower than 0.25 Hz (i.e. the stack light state is persistent on/off), the processor 410 determines that the stack light is in an non-twinkling state accordingly. As a result, logic relations between the first output voltage V1, the output voltage Vout and the stack light state may be inducted and shown in Table 1.

TABLE 1

| V1 | GPI | The stack light state |
|---|---|---|
| ~VH | L | Non-Twinkling |
| VH > V1 ≥ $V_{0.25\ Hz}$ | L | Non-Twinkling |
| $V_{0.25\ H}$ > V1 ≥ $V_{10\ Hz}$ | H | Twinkling |
| $V_{10\ Hz}$ ≥ V1 > VL | L | Non-Twinkling |
| ~VL | L | Non-Twinkling |

Figure 5:
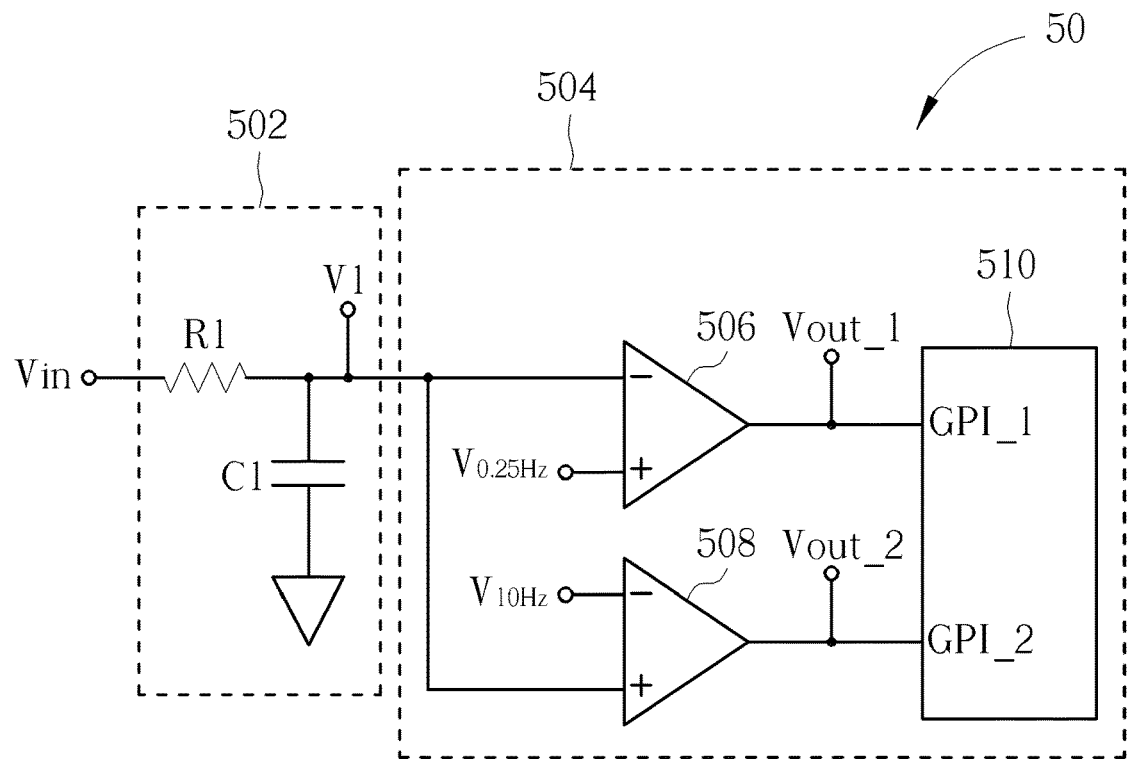

In another embodiment, please refer to FIG. 5, which is a schematic diagram of a detecting device 50 according to an embodiment of the present invention. In this embodiment, the detecting device 50 includes a low-pass filter 502 and a logic circuit 504, wherein the logic circuit 504 includes voltage comparators 506, 508 and a processor 510. Different with the detecting device 40, the processor 510 includes pins GPI 1, GPI 2 to determine the stack light state according to voltage levels of output voltages Vout 1, Vout 2 of the voltage comparators 506, 508. More specifically, when the voltage level of a first output voltage V1 is higher than that of $V_{0.25\ Hz}$, i.e. the pin GPI 1 is at a low voltage level, and the pin GPI 2 is at a high voltage level, the stack light is in the persistent on state. When the pin GPI 1 is at the high voltage level, and the pin GPI 2 is at the low voltage level, the stack light is in the persistent off state. When the pins GPI 1, GPI 2 are at the high voltage level at the same time, the stack light is in the twinkling state. Therefore, the logic relations between the first output voltage V1, the output voltage Vout and the stack light state may be inducted and shown in Table 2.

TABLE 2

| V1 | GPI_1 | GPI_2 | The stack light state |
|---|---|---|---|
| ~VH | L | H | Persistent On |
| VH > V1 ≥ $V_{0.25\ Hz}$ | L | H | Persistent On |
| $V_{0.25\ H}$ > V1 ≥ $V_{10\ Hz}$ | H | H | Twinkling |
| $V_{10\ Hz}$ ≥ V1 > VL | H | L | Persistent Off |
| ~VL | H | L | Persistent Off |

Figure 6:
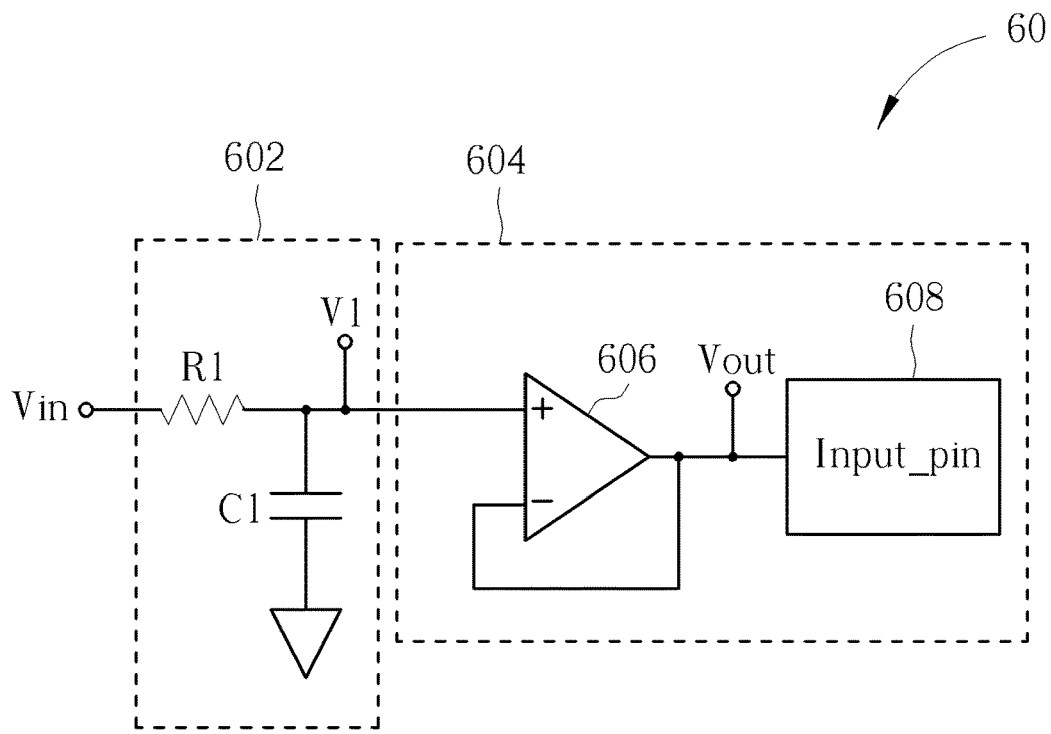

In another embodiment, please refer to FIG. 6, which is a schematic diagram of a detecting device 60 according to an embodiment of the present invention. The detecting device 60 includes a low-pass filter 602 and a logic circuit 604. Different with the detecting device 40 and the detecting device 50, the logic circuit 604 includes a voltage follower 606 and a processor 608. The voltage follower 606 has the characteristics that an input impedance is larger than an output impedance, and is utilized for avoiding impedance problems of a first output voltage V1, which are caused by impedance mismatch between the resistor R1 and an input impedance effect of an ADC Input pin of the processor 608, and further affect the dc voltage level of the first output voltage V1. Therefore, after the low-pass filter 602 generates the first output voltage V1 according to the PWM control signal, the voltage follower 606 avoids the impedance problems, such that the dc voltage level of the first output voltage V1 and an output voltage are completely identical. As a result, the dc voltage level of the first output voltage V1 may be actually reflected on the ADC Input pin, i.e. the voltage level of the output voltage Vout is equal to that of the first output voltage V1. In this way, the processor 608 may directly determine the stack light state according to the digital signal of the ADC Input pin corresponding to the dc voltage level of the first output voltage V1. In addition, the logic relations between the first output voltage V1, the output voltage Vout and the stack light state may be inducted and shown in Table 3.

TABLE 3

| V1 = Vout | The stack light state |
|---|---|
| Vout ≥ $V_{0.25\ Hz}$ | Persistent On |
| $V_{0.25\ Hz}$ > Vout ≥ $V_{10\ Hz}$ | Twinkling |
| $V_{10\ Hz}$ > Vout > VL | Persistent Off |

Figure 7:
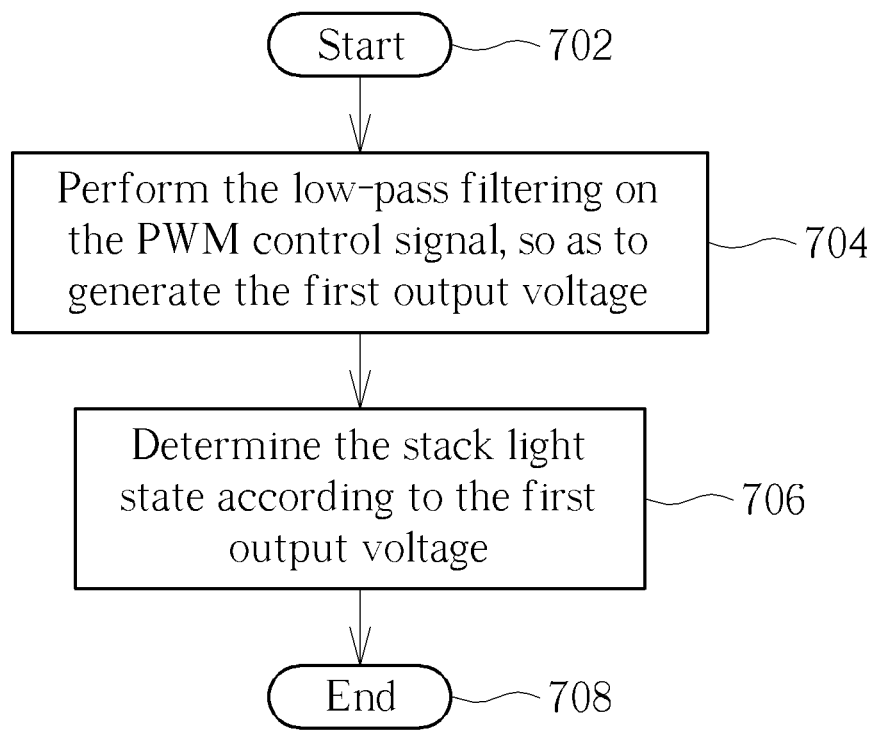
FIG. 7 is a schematic diagram of a detecting method according to an embodiment of the present invention.

Based on different applications and design concepts, the detecting device of the present invention may be implemented in all kinds of methods. Furthermore, an operation method of the detecting device may be concluded to a detecting method 70 as shown in FIG. 7, which includes the following steps:

Step 702: Start.

Step 704: Perform the low-pass filtering on the PWM control signal, so as to generate the first output voltage V1.

Step 706: Determine the stack light state according to the first output voltage V1.

Step 708: End.

The operation of the detecting method 70 may be referred to the above mentioned embodiments of the detecting devices 10, 40, 50, 60, and is not narrated herein for brevity.

Notably, those skilled in the art may properly design the detecting device according to different system requirements. For example, the range of the twinkling frequency of the stack light state, the implementation method of the logic circuit, an amount of the voltage comparator or the RC time constant of the low-pass filter may all be adjusted according to indications of a user or a manufacturer, or settings of a computer system, and not limited thereto, which all belong to the scope of the present invention.

In summary, the present invention utilizes the PWM control signal of the stack light, the low-pass filter and the logic circuit for correctly determining the output signal of the twinkling stack light, so as to effectively determine the stack light state and realize the detection of the stack light state in real-time.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A detecting device for detecting a stack light state, comprising:
   a low-pass filter configured to perform low-pass filtering on an input signal to generate a first output voltage; and
   a logic circuit coupled to the low-pass filter and configured to determine the stack light state according to the first output voltage;
   wherein the logic circuit comprises:
   a voltage follower; and
   a processor coupled to the voltage follower and configured to determine the stack light state according to the first output voltage;
   wherein the input signal is a pulse width modulation signal;
   wherein the stack light state is one of persistent on, persistent off and twinkling;
   wherein the input signal is a control signal related to a stack light, and the logic circuit is configured to determine a voltage value of the first output voltage corresponding to a range of twinkling frequency of the stack light accordingly; and
   wherein a range of the voltage value of a voltage level of the first output voltage is between a highest voltage level and a lowest voltage level of the pulse width modulation signal.

2. The detecting device of claim 1, wherein the low-pass filter generates the first output voltage according to a variation frequency of the input signal.

3. The detecting device of claim 1, wherein when the first output voltage is lower than or equal to a first voltage level, the processor determines that the stack light state is in persistent off state.

4. The detecting device of claim 1, wherein when the first output voltage is higher than a second voltage level, the processor determines that the stack light state is in persistent on state.

5. The detecting device of claim 1, wherein when the first output voltage is between a first voltage level and a second voltage level, the processor determines that the stack light state is in twinkling state.

6. A detecting device for detecting a stack light state, comprising:
    a low-pass filter configured to perform low-pass filtering on an input signal to generate a first output voltage; and
    a logic circuit coupled to the low-pass filter and configured to determine the stack light state according to the first output voltage;
    wherein the logic circuit comprises:
    a plurality of comparator circuits configured to generate a plurality of logic results according to the first output voltage; and
    a processor coupled to the plurality of comparator circuits and configured to determine the stack light state according to the plurality of logic results;
    wherein the plurality of logic results are related to a relationship between a first voltage level and a second voltage level;
    wherein the input signal is a pulse width modulation signal;
    wherein the stack light state is one of persistent on, persistent off and twinkling;
    wherein the input signal is a control signal related to a stack light, and the logic circuit is configured to determine a voltage value of the first output voltage corresponding to a range of twinkling frequency of the stack light accordingly; and
    wherein a range of the voltage value of a voltage level of the first output voltage is between a highest voltage level and a lowest voltage level of the pulse width modulation signal.

7. The detecting device of claim 6, wherein when the first output voltage is lower than or equal to the first voltage level, the processor determines that the stack light state is in persistent off state.

8. The detecting device of claim 6, wherein when the first output voltage is higher than the second voltage level, the processor determines that the stack light state is in persistent on state.

9. The detecting device of claim 6, wherein when the first output voltage is between a first voltage level and a second voltage level, the processor determines that the stack light state is in twinkling state.

10. The detecting device of claim 6, wherein the low-pass filter generates the first output voltage according to a variation frequency of the input signal.

11. A detecting method for detecting a stack light state, comprising:
    performing low-pass filtering by a low pass filter on an input signal to generate a first output voltage; and
    determining the stack light state according to the first output voltage by a logic circuit; wherein the logic circuit is coupled to the low pass filter; and
    wherein the logic circuit comprises a voltage follower and a processor; and the processor is coupled to the voltage follower;
    wherein the input signal is a pulse width modulation signal;
    wherein the stack light state is one of persistent on, persistent off and twinkling;
    wherein the input signal is a control signal related to a stack light, and the logic circuit is configured to determine a voltage value of the first output voltage corresponding to a range of twinkling frequency of the stack light accordingly; and
    wherein a range of the voltage value of a voltage level of the first output voltage is between a highest voltage level and a lowest voltage level of the pulse width modulation signal.

12. The detecting method of claim 11, wherein performing the low-pass filtering on the input signal is generating the first output voltage according to a variation frequency of the input signal.

13. The detecting method of claim 11, wherein the step of determining the stack light state according to the first output voltage comprises: when the first output voltage is lower than or equal to a first voltage level, determining that the stack light state is in persistent off state.

14. The detecting method of claim 11, wherein the step of determining the stack light state according to the first output voltage comprises: when the first output voltage is higher than a second voltage level, determining that the stack light state is in persistent on state.

15. The detecting method of claim 11, wherein the step of determining the stack light state according to the first output voltage comprises: when the first output voltage is between a first voltage level and a second voltage level, determining that the stack light state is in twinkling state.

* * * * *